United States Patent [19]

Afzali-Ardakani et al.

[11] Patent Number: 5,391,464
[45] Date of Patent: Feb. 21, 1995

[54] THIOXANTHONE SENSITIZER FOR RADIATION SENSITIVE POLYIMIDES

[75] Inventors: Ali Afzali-Ardakani, Yorktown Heights, N.Y.; Phillip J. Brock, Sunnyvale; Daniel J. Dawson, San Jose, both of Calif.; Jeffrey D. Gelorme, Plainville, Conn.

[73] Assignee: International Business Machines Corporation, Armonk, N.Y.

[21] Appl. No.: 174,650

[22] Filed: Dec. 28, 1993

[51] Int. Cl.6 .................. G03C 1/725; G03C 1/73
[52] U.S. Cl. ................... 430/281; 430/270; 430/325; 522/50; 522/53
[58] Field of Search ............ 430/270, 281, 325; 522/50, 53; 548/423

[56] References Cited

U.S. PATENT DOCUMENTS

| | | |
|---|---|---|
| 3,844,790 | 10/1974 | Chang et al. ............... 96/86 P |
| 4,385,182 | 5/1983 | Fischer et al. ............... 549/27 |
| 4,418,138 | 11/1983 | Curtis ........................... 430/253 |
| 4,585,876 | 4/1986 | Fischer et al. ............... 548/423 |
| 4,594,400 | 10/1986 | Kvita et al. .................. 526/256 |
| 4,681,950 | 7/1987 | Fischer et al. ............... 549/27 |
| 4,916,169 | 4/1990 | Boardman et al. ........... 522/27 |

OTHER PUBLICATIONS

Fischer, "105 Aromatic Nucleophilic Substitution Part 3[1]) Preparation of Novel 9-Oxo-9H-thoxanthene- and 9-Oxo-9H-xanthenedicarboximides and -dicarboxylates" Helvetical Chimica Acta–vol. 74 (1991).

*Primary Examiner*—Marion E. McCamish
*Assistant Examiner*—Laura S. Weiner
*Attorney, Agent, or Firm*—Robert B. Martin

[57] ABSTRACT

The present invention relates to thioxanthone sensitizers for radiation sensitive polyimide compositions for use in manufacturing integrated circuits such as chips, thin film packaging and printed circuit boards.

5 Claims, No Drawings

THIOXANTHONE SENSITIZER FOR RADIATION SENSITIVE POLYIMIDES

FIELD OF THE INVENTION

The present invention relates to sensitizer for radiation sensitive polyimides for use in manufacturing integrated circuits such as chips, thin film packaging and printed circuit boards.

BACKGROUND OF THE INVENTION

Polyimides are known in the art for use in the manufacture of integrated circuits including chips (e.g. chip back end of line), thin film packages and printed circuit boards. Polyimides are useful in forming dielectric interlayers, passivation layers, alpha particle barriers and stress buffers. Radiation sensitive polyimides are particularly useful as an interlayer dielectric material to insulate the conductor wiring interconnecting the chips on a multichip module. This is known as thin-film wiring. A multichip module is an intermediate level of packaging between the chips and the circuit board. Multichip modules are generally known in the art. Multichip modules are made up of multiple layers of power, signal and ground planes which deliver power to the chips and distribute the input/output signals between chips on the module or to/from the circuit board.

Radiation sensitive polyimides can also be used as the dielectric material for insulating the conductor wiring on a silicon carrier as a multichip module. The use of radiation sensitive polyimide provides a simplified method for the fabrication of the patterned polyimide required for these thin film wiring schemes. It is important that the final properties of the patterned polyimide are not significantly altered relative to the nonradiation sensitive polyimides also used in forming the multichip module.

Radiation sensitive polyimides useful as a dielectric interlayer for conductor wiring in a multichip module are known in the art. There are two general types of radiation sensitive compositions used to form a patterened polymide film. The first type of composition comprises an unimidized polyamic acid ester having a crosslinkable moiety or an unimidized polyamic acid salt having a crosslinkable moiety, a radiation sensitive initiator and a sensitizer. The sensitizer functions to transfer energy from incident radiation to the radiation sensitive initiator. These compositions are generally first patterned and then imidized. For example, "Polyimide Coatings" by Craig, Electronic Materials Handbook, Vol. 1, discloses negative tone radiation sensitive polyamic acid esters where the ester moiety is covalently bound to the polymer backbone and contains unsaturated linkages in the form of acrylates or methacrylates. Upon exposure to light, these groups, in conjunction with a suitable radiation sensitive initiator and a sensitizer, crosslink via a free radical mechanism resulting in differential solubility between the exposed and unexposed regions. Subsequent development with a suitable solvent system followed by imidization results in a negative tone imaged polyimide dielectric interlayer. An example of the polyamic acid salt radiation sensitive composition is disclosed in Yoda et al., "New Photosensitive High Temperature Polymers for Electronic Applications," J. Macromol. Sci.-Chem., A21(13&a4), 1641 (1984). Yoda discloses incorporating in the polymer an alkyl ammonium salt as a radiation sensitive group. The alkyl ammonium salt is formed from the reaction of a suitable poly(amic acid) with a tertiary amine having unsaturated groups in the form of acrylates or methacrylates.

The second type of radiation sensitive composition comprises soluble, fully imidized polyimide having crosslinkable groups, a radiation sensitive initiator and a sensitizer. Upon exposure to radiation, the crosslinking reaction introduces differential solubility in the polyimide film which can then be developed with organic solvents. Examples of this type of radiation sensitive composition are disclosed in J. Pfeiffer et al., "Direct Photoimaging of Fully Imidized Solvent-Soluble Polyimides, "Proc. Second Intern. Conference on Polyimides, Ellenville, N.Y. (1985) which is incorporated by reference. Such radiation sensitive compositions are also commerically available such as from Amoco Corporation under the trademark Ultradel.

To form a film of the radiation sensitive composition in the manufacture of integrated circuits, it is necessary to dissolve the composition in a suitable organic solvent having acceptable properties. Unfortunately, polyimides, polyamic acid salts and polyamic esters are generally insoluble in most organic solvents. However, many polyimides and polyamic acid salts and esters are soluble in N-methylpyrrolidone (NMP) which is particularly useful in the manufacture of integrated circuits. Therefore, it is desired that the radiation sensitive initiator and the sensitizer each have good solubility in NMP. The good solubility enables the composition to be formed as a homogeneous film in the manufacture of integrated circuits and also enables the storage of the composition at a low temperature prior to use without precipitation of the initiator or the sensitizer.

Thioxanthone sensitizers are known in the art, as for example, disclosed in Fischer et al., U.S. Pat. No. 4,681,950. However, the thioxanthones disclosed by Fischer form a gel in the lithographic composition, or have relatively low solubility in NMP. The low solubility of the thioxanthone in NMP causes precipitation of the thioxanthone during storage prior to its use in manufacturing. Therefore these thioxanthones are not suitable for use in radiation sensitive compositions used to form a patterned polyimide film in the manufacture of integrated circuits.

It is therefore an object of the present invention to provide an improved sensitizer for use in radiation sensitive polyimide compositions.

SUMMARY OF THE INVENTION

The present invention relates to a class of thioxanthones and to radiation sensitive polyimide, polyamic acid salt or polyamic acid ester compositions comprising the novel thioxanthone. The thioxanthones of the present invention have the formula:

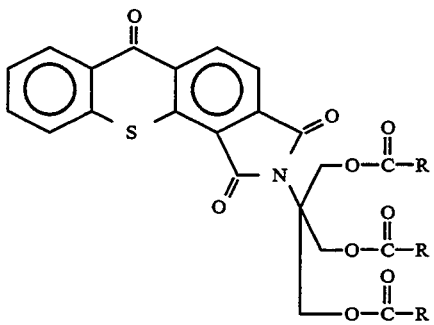

where each R is independently alkyl.

This class of compounds has an unexpectedly enhanced solubility in NMP.

The radiation sensitive compositions of the present invention comprise (i) polyimide having a crosslinkable substituent or polyamic acid salt or ester having a crosslinkable substituent; (ii) a crosslinking initiator and (iii) a thioxanthone sensitizer of the present invention. The compositions have enhanced solubility in NMP to enable their storage at low temperature prior to use without precipitation of the sensitizer. The present invention also relates to the process for imaging these compositions.

A more thorough disclosure of the present invention is presented in the detailed description which follows:

DETAILED DESCRIPTION OF THE INVENTION

The present invention relates to a novel class of thioxanthones and to radiation sensitive polyimide, polyamic acid salt or polyamic acid ester compositions comprising the thioxanthone.

The thioxanthones of the present invention have the formula:

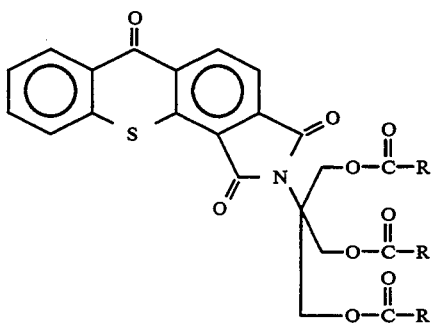

where each R is independently alkyl.

The R alkyl group comprises a carbon chain having up to 10 (preferably up to about 7) carbon atoms which may be linear, branched or cyclic, preferably linear.

The compounds of the present invention function as sensitizers to absorb energy from incident radiation and to then transfer that energy to an initiator. The compounds of the present invention uniquely absorb energy from incident radiation having a wavelength of about 360 to 480 nanometers (nm), preferably about 380–440 nm, more preferably about 400–440 nm. This property enables the compounds of the present invention to function as sensitizers in radiation-sensitive polyimide and polyamic acid ester compositions, each of which absorb radiation strongly at wavelengths of about 200 to 360 nm but not at wavelengths above about 360 nm. After absorbing energy from the incident radiation, the sensitizers of the present invention transfer the energy to the initiator.

The compounds of the present invention also exhibit enhanced solubility in NMP of greater than about 3 weight % in NMP at $-10°$ C., preferably greater than about 5 weight % at $-10°$ C. This enhanced solubility importantly enables the storage of radiation sensitive polyimide and polyamic acid salt or ester compositions at low temperature prior to use, without precipitation of the sensitizer from the composition. Such low temperature storage is desired to inhibit premature curing of the composition. Preferred compounds are those where R is $C_1$-$C_7$ n-alkyl which have NMP solubility of greater than about 10 weight % at $-10°$ C.

The compounds of the present invention can be prepared by standard synthetic procedures. Thioxanthone-3,4-dicarboxylic acid anhydride is reacted with tris(hydroxymethyl) aminomethane to form the corresponding imide triol which is in turn reacted with the appropriate anhydride (e.g. propionic anhydride) to form the compound of the present invention.

The thioxanthones of the present invention can optionally be substituted with a variety of substituents on the aromatic ring such as alkyl, hydroxy, alkoxy (methoxy), nitro, phenoxy, or halo which do not unacceptably interfere with the sensitivity or the solubility of the compound and such compounds should be contemplated as equivalents of those claimed herein.

The present invention also relates to radiation-sensitive compositions comprising (i) polyimide having a crosslinkable substituent polyamic acid salt having a crosslinkable substituent or polyamic acid ester having a crosslinkable substituent; (ii) a crosslinking initiator and (iii) the sensitizer of the present invention. The composition is dissolved in NMP prior to use. Suitable polyimides and polyamic acid salts and esters for use in the present invention are well known in the art and are commercially available.

Suitable polyamic acid salt and ester polymers have the following general repeat unit:

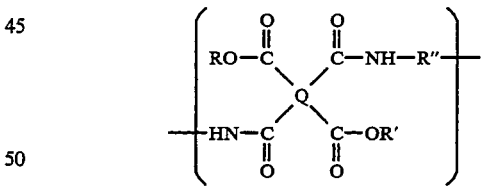

where R, R' and R" are each independently selected from alkyl or aryl and optionally substituted with suitable substituents which do not interfere with the imidization nor the final properties of the polyimide. Generally R and R' are the same and have crosslinkable linkage such as unsaturated linkages. R and R' preferably ester substituents comprising monoethylenically unsaturated groups or monoacetylenically unsaturated groups, and/or monoethylenically unsaturated or monoacetylenically unsaturated amine salts. A preferred R and R' are 1-propenylcarbonyloxyethyl and ethenylcarbonyloxyethyl.

A suitable R" is selected from alkyl or aryl and optionally substituted with suitable substituents which do not interfere with the imidization nor final properties of the polyimide. Suitable R" groups generally comprise a monocyclic or polycyclic divalent aromatic radical in which the aromatic rings may be aromatic, heterocyclic, or directly attached rings, e.g., biphenylene and naphthalene. Suitable R" may be selected from

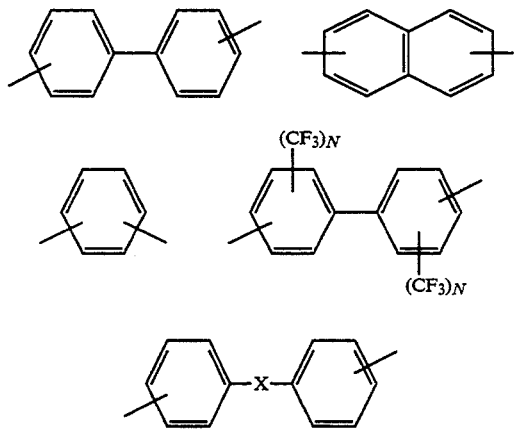

wherein X is selected from the group consisting of an alkylene chain having 1–3 carbon or halocarbon atoms, carbonyl, —O—, —S—, —SO$_2$— and —N— alkyl. The aromatic radical can optionally be substituted by a variety of substituents such as alkyl, haloalkyl (trifluoromethyl), halo or the like. Suitable R" include:

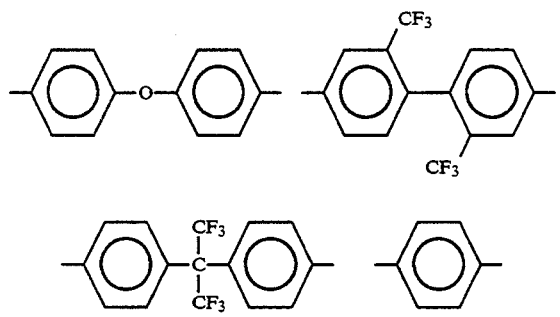

Suitable Q groups generally comprise tetravalent organic radicals selected from cycloalkyl, aromatic and aromatic heterocylic wherein the aromatic generally has at least 6 carbon atoms characterized by benzenoid unsaturation and the four valencies are fixed by pairs on separate adjacent carbon atoms. When the aromatic radical comprises several rings connected together, the linking elements are, for example, a single bond or one of the following atoms or groups:
—O—; —S—; —SO—; —SO$_2$—; —CO—; —CHOH—; —CH$_2$—; —CF$_2$—; —C(CH$_3$)$_2$—; —C(CF$_3$)$_2$—; —COO—; —CONH—; —CO—O—(CH$_2$-)$_2$—O—CO—; —Si(CH$_3$)$_2$—; —O—Si(CH$_3$)$_2$—O—.
Suitable Q groups include the following:

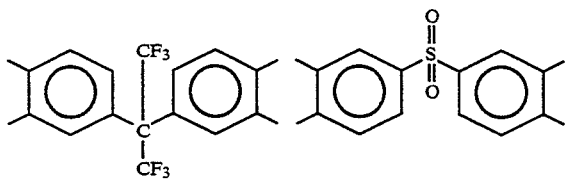

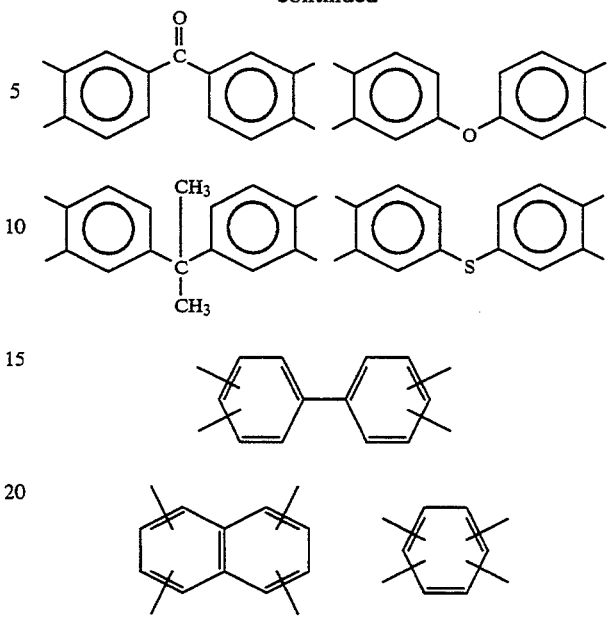

Other suitable Q groups will be known to those skilled in the art. Q may also be substituted with a variety of substituents known to those skilled in the art which do not interfere with the imidization nor the final properties of the polyimide. Copolymers of polyamic esters and partially imidized polyamic esters (e.g. prepared by controlled thermal imidization) may also be used in compositions of the present invention.

The nature of Q and R" may impact the absorption of the radiation by the film and also the properties of the polyimide film. Generally, it is desired that the ester transmit light in the 350–500 nm range and form a polyimide with a rigid backbone to resist swelling and cracking during development. Suitable Q and R" groups to obtain such properties are disclosed above and those skilled in the art will know other suitable Q and R" groups to obtain these properties. Other suitable types of polyamic acid esters are disclosed in Swanson et al., European Patent Application 538683 published Apr. 28, 1993, the disclosure of which is incorporated herein by reference. A preferred polyamic ester is biphenyltetracarboxylic dianhydride-phenylene diamine-2,2-bis(4-aminophenyl) hexafluoropropane diester where the ester is preferably hydroxypropyl methacrylate or hydroxyethyl methacrylate. Suitable polyamic esters will have a molecular weight of about 5000 to about 100,000, preferably about 10,000 to about 50,000. The polyamic alkyl esters will generally comprise about 80 weight % to about 99 weight % of the composition of the present invention exclusive of solvent. Polyamic alkyl esters used in the present invention are readily prepared by art known techniques such as those disclosed in Volksen et al. "Polyamic Alkyl Esters: Versatile Polyimide Precursors for Improved Dielectric Coating", 41st Electronic Components and Technology Conference Proceedings, p. 572 (May 1991), the disclosure of which is incorporated herein by reference.

The composition of the present invention also contains an initiator. Upon acquiring energy from the sensitizer of from incident light, the initiator functions to crosslink the polymide or the polyamic acid salt or ester. Preferably, the initiator is radiation-sensitive to enable absorption of energy from the incident light. Suitable initiators are benzophenones, alkylphenones and benzoin derivatives. Preferred initiators are alkylphenones. Other suitable crosslinking initiators will be known to those skilled in the art. The compositions of the present invention generally comprise about 1 to 5 weight % of the initiator. The initiator is soluble in NMP at low temperature to enable the storage of the composition prior to use.

The composition of the present invention also comprises a sensitizer of the present invention at about 1 to 10 weight %. Preferably 2 to 7 weight % more preferably 4 to 5 weight %.

The radiation sensitive compositions of the present invention are useful in the manufacture of integrated circuits such as chips, thin film packaging and printed circuit boards.

The composition is generally coated onto a substrate as a thin film by dissolving the composition in a suitable organic solvent, preferably N-methylpyrrolidone ("NMP"). Other solvents include gamma butyrolactone, dimethylsulfoxide, dimethylacetamide or dimethylformamide. Optionally, the composition can be dissolved in a mixture of NMP and anisole, N-cyclohexylpyrrolidone or other solvents known to those skilled in the art. The solution will generally comprise about 5 to 50 weight % of the composition preferably about 10 to 40 weight %, more preferably about 25 to 35 weight %. The film can be coated on the substrate using art known techniques such as spin or spray coating, or doctor blading. Optionally, the film may be pre-exposure baked to remove a portion of the NMP. In the second step of the process, the film is imagewise exposed to radiation suitably at a wavelength which has strong absorption by the sensitizer or the initiator and minimal absorption by the polyimide or the polyamic acid and/or ester. The energy from the radiation activates the initiator to cause crosslinking of the polymer in the exposed areas. The crosslinking provides differential solubility between the exposed and unexposed regions of the film. Optionally, the film may be post-exposure baked to enhance the crosslinking. In the next step, the image is developed with a suitable solvent. Suitable solvents include polar solvents, preferably aprotic polar solvents, such as dimethylformamide, dimethylacetamide, N-methylpyrrolidone or mixtures thereof. The solvent can be admixed with a limited amount of polymer nonsolvents such as glymes or alkyl esters.

After the substrate has been exposed, circuit patterns can be formed in the exposed areas by coating the substrate with a conductive material such as conductive metals by art known techniques such as evaporation, sputtering, plating, chemical vapor deposition or laser induced deposition. The surface of the film can be milled to remove any excess conductive material. Dielectric materials may also be deposited by similar means during the process of making circuits. Inorganic ions such as boron, phosphorous or arsenic can be implanted in the substrate in the process for making p or n doped circuit transistors. Other means for forming circuits are well known to those skilled in the art.

The following examples were prepared by standard synthetic procedures. The examples fall within the scope of, and serve to exemplify, the more generally described compounds set forth above. The examples are presented for illustrative purposes only, and are not intended as a restriction on the scope of the invention.

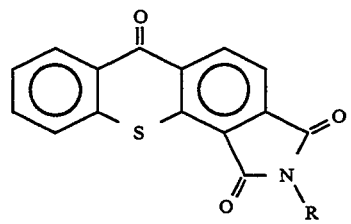

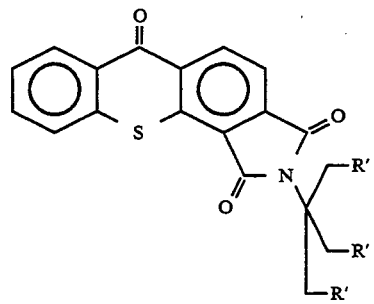

\*\*Weight %
Solubility in NMP at −10° C.

| | R | |
|---|---|---|
| *1. | —CH$_2$CH$_2$OH | <0.5% |
| *2. | —CH$_2$CH$_2$SO$_3$Na | gel formation |
| *3. | —CH$_2$CH=CH$_2$ | <0.25% |
| *4. | —CH$_2$CH$_2$N(CH$_3$)$_2$ | gel formation |
| | R' | |
| 5. | Propionate | 15 |
| 6. | Mixed Acetate/Propionate | 5–7 |
| 7. | n-Butyrate | 15 |
| 8. | sec-Butyrate | 5 |
| 9. | Valerate | 15 |
| 10. | Heptanoate | 10 |

*Prior art thioxanthones
\*\*Weight % of compound in a mixture of compound and NMP.

The enhanced solubility of the thioxanthones of the present invention in NMP enables their use as sensitizers for radiation sensitive polyimides in the manufacture of integrated circuits.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A radiation sensitive composition for use in the manufacture of integrated circuits comprising:
   (i) a polymer selected from a polyamic acid ester having a crosslinkable substituent, a polyamic acid salt having a crosslinkable substituent or a polyimide having a crosslinkable substituent
   (ii) a crosslinking initiator, and
   (iii) a thioxanthone having the formula:

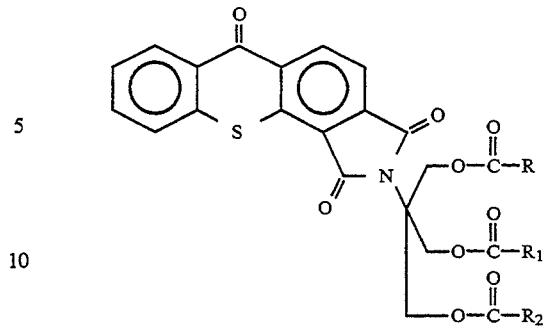

where R, $R_1$ and $R_2$ are each independently $C_{1-10}$ alkyl.

2. The composition of claim 1 wherein said polymer is a polyamic acid ester.

3. The composition of claim 2 where the ester is monoethylenically unsaturated or monoacetylenically unsaturated.

4. The composition of claim 2 wherein said polyamic acid ester is biphenyltetracarboxylic dianhydride-phenylene diamine-2,2-bis(4-aminophenyl) hexafluoropropane diester.

5. The composition of claim 2 further comprising N-methylpyrrolidone (NMP).

* * * * *